(12) United States Patent
Schwiebert et al.

(10) Patent No.: US 7,111,994 B2
(45) Date of Patent: Sep. 26, 2006

(54) INTEGRAL INSERT MOLDED FIBER OPTIC TRANSCEIVER ELECTROMAGNETIC INTERFERENCE SHIELD

(75) Inventors: Matthew K. Schwiebert, Cupertino, CA (US); R. Sean Murphy, Sunnyvale, CA (US)

(73) Assignee: Avago Technologies Fiber IP (Singapore) Ptd. Ltd., Singapore (SG)

( * ) Notice: Subject to any disclaimer, the term of this patent is extended or adjusted under 35 U.S.C. 154(b) by 107 days.

(21) Appl. No.: 10/808,672

(22) Filed: Mar. 24, 2004

(65) Prior Publication Data

US 2005/0213871 A1   Sep. 29, 2005

(51) Int. Cl.
*G02B 6/36* (2006.01)
*G02B 6/00* (2006.01)
*G02B 6/10* (2006.01)
*B29D 11/00* (2006.01)
*H05K 9/00* (2006.01)

(52) U.S. Cl. ............................ 385/92; 385/88; 385/91; 264/1.1; 264/1.24; 264/1.25; 361/818

(58) Field of Classification Search ................. 385/92, 385/88, 91; 361/818; 264/1.1, 1.24, 1.25
See application file for complete search history.

(56) References Cited

U.S. PATENT DOCUMENTS 5,386,345 A * 1/1995 Matsuzaki et al. .......... 361/816

(Continued)

OTHER PUBLICATIONS

"What is Insert Molding?", Microplastics Inc., Web page downloaded on Feb. 19, 2004 from http://www.microplasticsinc.com/what_is_insert_molding.htm, 2 pages.

(Continued)

*Primary Examiner*—Brian Healy
*Assistant Examiner*—Jerry Martin Blevins (57) ABSTRACT

A fiber optic module includes a first housing insert molded with an electromagnetic interference (EMI) shield, an optoelectronic subassembly mounted in the first housing, and a second housing mounted to the first housing to enclose the optoelectronic subassembly. The EMI shield includes a conductive mesh and conductive contact fingers. The first housing includes a non-conductive housing floor, non-conductive housing sidewalls, and a non-conductive nose defining at least one connector receptacle, wherein the housing floor and the housing sidewalls are injection molded through the mesh of the EMI shield to be integral with the nose and so that the fingers at least partially surround the nose.

18 Claims, 5 Drawing Sheets

U.S. PATENT DOCUMENTS

| | | |
|---|---|---|
| 6,335,869 B1 | 1/2002 | Branch et al. |
| 6,369,924 B1 | 4/2002 | Scharf et al. |
| 6,407,932 B1 | 6/2002 | Gaio et al. |
| 6,459,517 B1 | 10/2002 | Duncan et al. |
| 6,540,414 B1 * | 4/2003 | Brezina et al. ............... 385/92 |
| 6,551,117 B1 | 4/2003 | Poplawski et al. |
| 6,607,308 B1 | 8/2003 | Dair et al. |
| 6,609,838 B1 | 8/2003 | Branch et al. |
| 6,634,803 B1 | 10/2003 | Brezina et al. |
| 6,659,655 B1 | 12/2003 | Dair et al. |
| 6,666,589 B1 | 12/2003 | Brezina et al. |
| 6,738,265 B1 * | 5/2004 | Svarfvar et al. ............ 361/818 |
| 6,832,856 B1 * | 12/2004 | Chiu et al. ................... 385/53 |
| 2003/0118293 A1 | 6/2003 | Canace et al. |
| 2005/0152701 A1 * | 7/2005 | Liu et al. .................... 398/135 |

OTHER PUBLICATIONS

"Sanysu's Record Breaking Assemblies and Insert Molding in Micro Precise Injection Mol . . . ", webpage downloaded on Feb. 19, 2004 from http://www.sansyu.com/records_assem.htm, 1 page.

"Insert Molding by Rayco Mold", Rayco Mold & Manufacturing, web page downloaded on Feb. 19, 2004 from http://rayco-mold-mfg.com/_content/Services/Mfg/Insert_Molding.htm, 3 pages.

"Insert Molded Plastics", Supplier's Directory of Thomas Register, web page downloaded on Feb. 19, 2004 from http://www.thomasregisterdirectory.com/molded_plastics/insert_molded_plastics_0022033_1.html, 5 pages.

* cited by examiner

INTEGRAL INSERT MOLDED FIBER OPTIC TRANSCEIVER ELECTROMAGNETIC INTERFERENCE SHIELD

DESCRIPTION OF RELATED ART

As communication bit rates and fiber optic transceiver densities in networking equipment increase, more EMI (electromagnetic interference) is radiated from the optical ports. Excessive EMI emission causes interference with other electronic equipment.

Low fiber optic transceiver cost is achieved by using injection molded plastic parts whenever possible. In addition to having low material and fabrication costs, injection molded plastic parts enable snap-fit assemblies, further decreasing the cost of the transceiver by eliminating fasteners and assembly labor. The disadvantages of injection molded plastic transceiver housings include relatively low mechanical strength and poor EMI performance (since the plastic is electromagnetically transparent, allowing EMI to escape from the transceiver module thru the bezel opening).

One prior art solution uses external sheet metal shields on fiber optic transceivers. However, only the perimeter is shielded and EMI is allowed to escape directly through the housing and the nose of the transceivers. Furthermore, this allows EMI to exit the port and couple to metal parts in fiber connectors.

Another prior art solution uses metal housings on fiber optic transceivers. Metal housings are more costly than plastic housings, and often require fasteners to assemble because snap-together features are difficult to design in metal. These fasteners add additional material and labor cost.

Another prior art solution uses metal doors to enclose networking equipment. However, metal doors add to the overall cost of the equipment, inhibit access for service, and hamper fiber routing.

Another prior art solution uses internal sheet-metal shields, which are inserted through the cross-section of the plastic fiber optic transceiver housing. However, this requires perforation of the housing resulting in a dramatically reduced housing cross-section where the shield is inserted. The reduced cross-section decreases the strength of the housing under bending, resulting in breakage of the housing when fiber optic connector is subject to side loading (i.e., forces applied to the fiber acting perpendicular to the long axis of the transceiver).

Another prior art solution uses metalized plastic fiber optic transceiver housing. However, metallization is expensive and may flake off and contaminate the optics in the transceiver.

Thus, what is needed is an optic fiber transceiver module that solves the problem of the triple-tradeoff between mechanical strength, cost, and EMI shielding performance.

SUMMARY

In one embodiment of the invention, a fiber optic module includes a first housing insert molded with an electromagnetic interference (EMI) shield, an optoelectronic subassembly mounted in the first housing, and a second housing mounted to the first housing to enclose the optoelectronic subassembly. The EMI shield includes a conductive mesh and conductive fingers. The first housing includes a non-conductive housing floor, non-conductive housing sidewalls, and a non-conductive nose defining at least one connector receptacle, wherein the housing floor and the housing sidewalls are injection molded through the mesh of the electrically conductive EMI shield to be integral with the nose and so that the fingers at least partially surround the nose to make contact with ground.

BRIEF DESCRIPTION OF THE DRAWINGS

Use of the same reference numbers in different figures indicates similar or identical elements.

DETAILED DESCRIPTION

Figure 1:
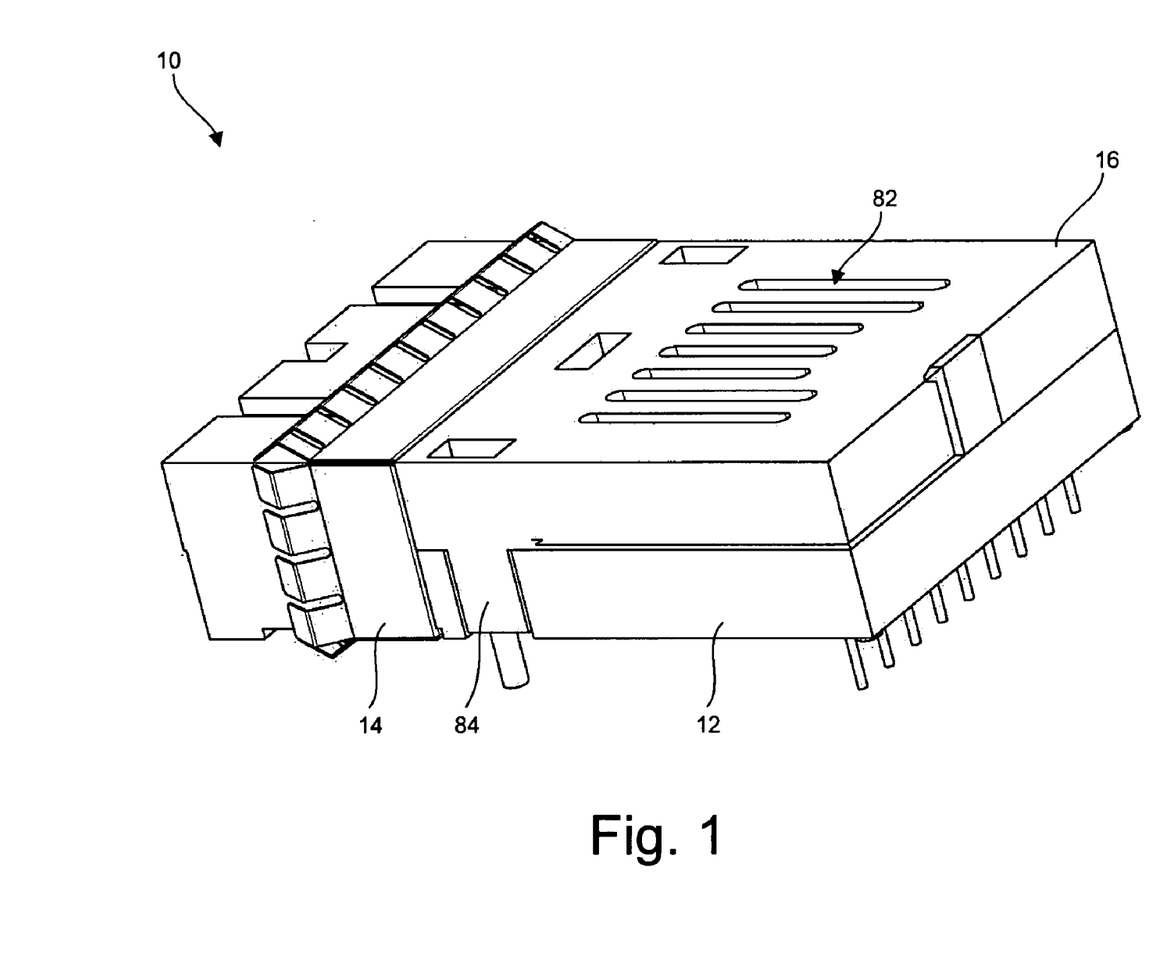
FIG. 1 illustrates a fiber optic module in one embodiment of the invention.

FIG. 1 illustrates a fiber optic module 10 in one embodiment of the invention. Fiber optic module 10 can be a transmitter, a receiver, or a transceiver of any form factor, such as a SFF (Small Form-Factor), SFP (Small Form-factor Pluggable), GBIC (Gigabit Interface Converter), 1×9, or MTRJ (Multifiber in the Telecom RJ form factor) transceiver. Fiber optic module 10 includes a lower housing 12 insert molded with an electromagnetic interference (EMI) shield 14, and an upper housing 16 mounted atop lower housing 12 secured by cantilever hooks 84.

Figure 2:
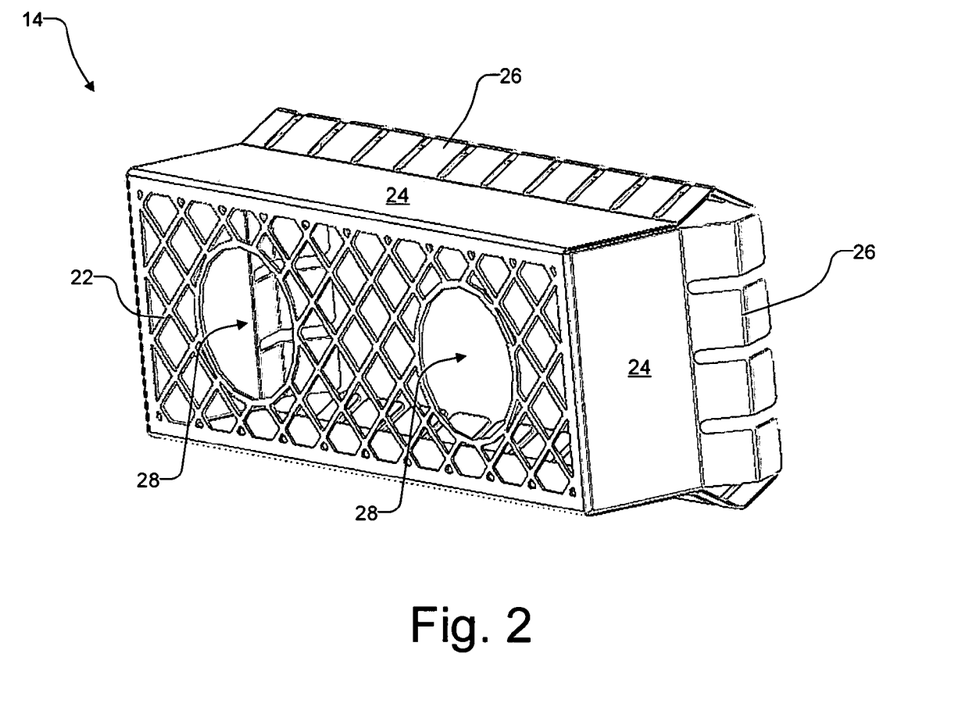
FIG. 2 illustrates an electromagnetic interference (EMI) shield in one embodiment of the invention.

FIG. 2 illustrates EMI shield 14 separate from lower housing 12 in one embodiment of the invention. EMI shield 14 includes an electrically conductive mesh 22, electrically conductive shield sidewalls 24 around mesh 22, and electrically conductive contact fingers 26 (not all labeled) extending from shield sidewalls 24. Mesh 22 has small perforations that shield EMI over the frequency range of interest from escaping through a nose 54 (FIG. 3) of fiber optic module 10. Mesh 22 further defines openings 28 for receiving fiber optic connectors from a fiber optic cable. Contact fingers 26 also shield EMI from escaping around fiber optic module 10 when it is mounted to a bezel of a host device. Contact fingers 26 also provide frequent physical contact to the bezel opening thru which the module is inserted. Typically EMI shield 14 is grounded through this physical contact with the bezel of the host device, which is grounded. EMI shield 14 can be stamped or etched from a sheet metal and then folded into its final shape with well known sheet metal fabrication techniques. In one embodiment, shield sidewalls 24 ensure that contact fingers 26 are in the correct position (along the long axis of the module) to interface to the bezel opening where they contact chassis ground. In other embodiments, shield sidewalls 24 are not necessary if the bezel happens to be in the same plane as the insert-molded conductive mesh 22 so there is already physical contact between EMI shield 14 and the chassis ground.

Figure 3:
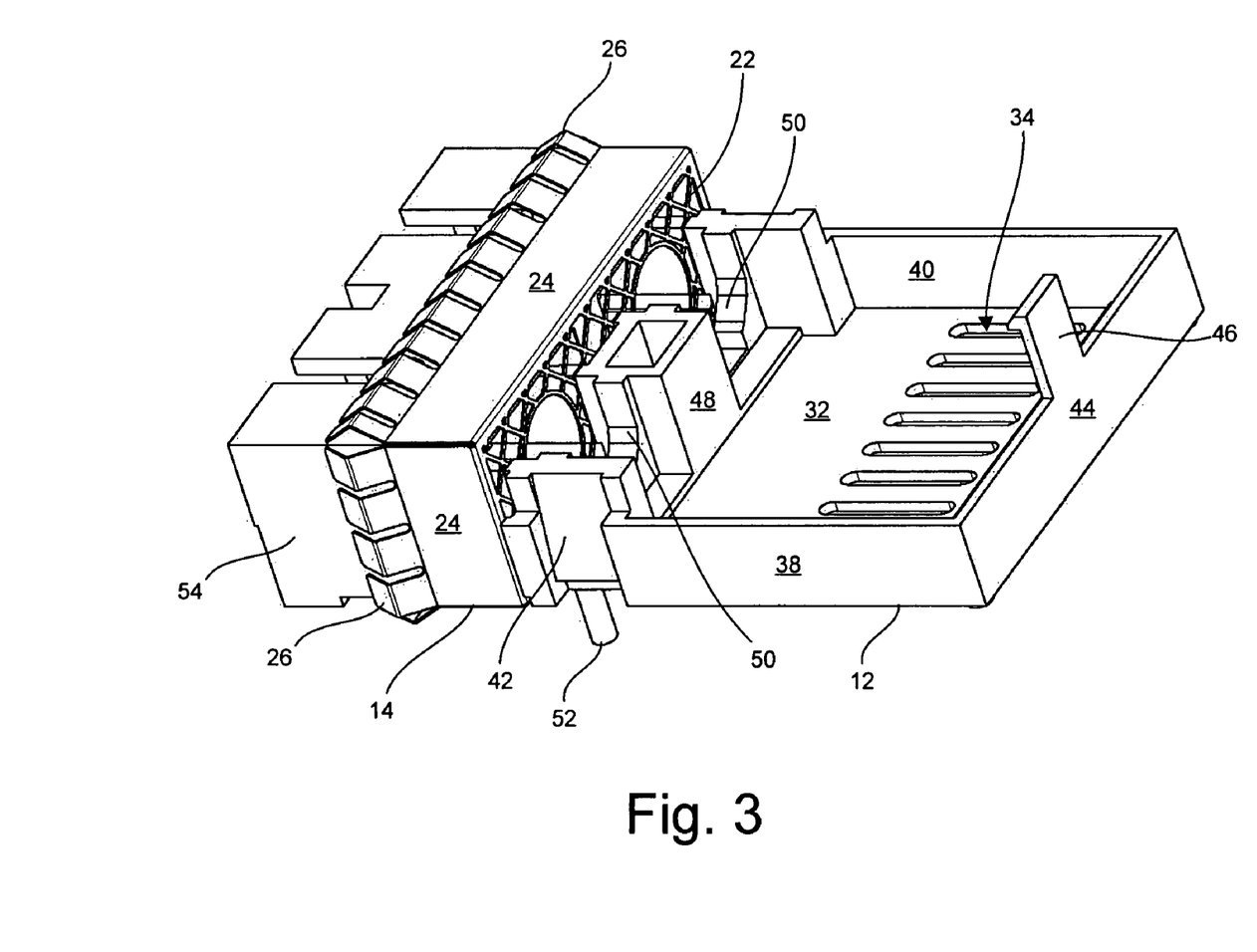
FIGS. 3 and 4 illustrate two views of a lower housing of the fiber optic module of FIG. 1 in one embodiment of the invention.
Figure 4:
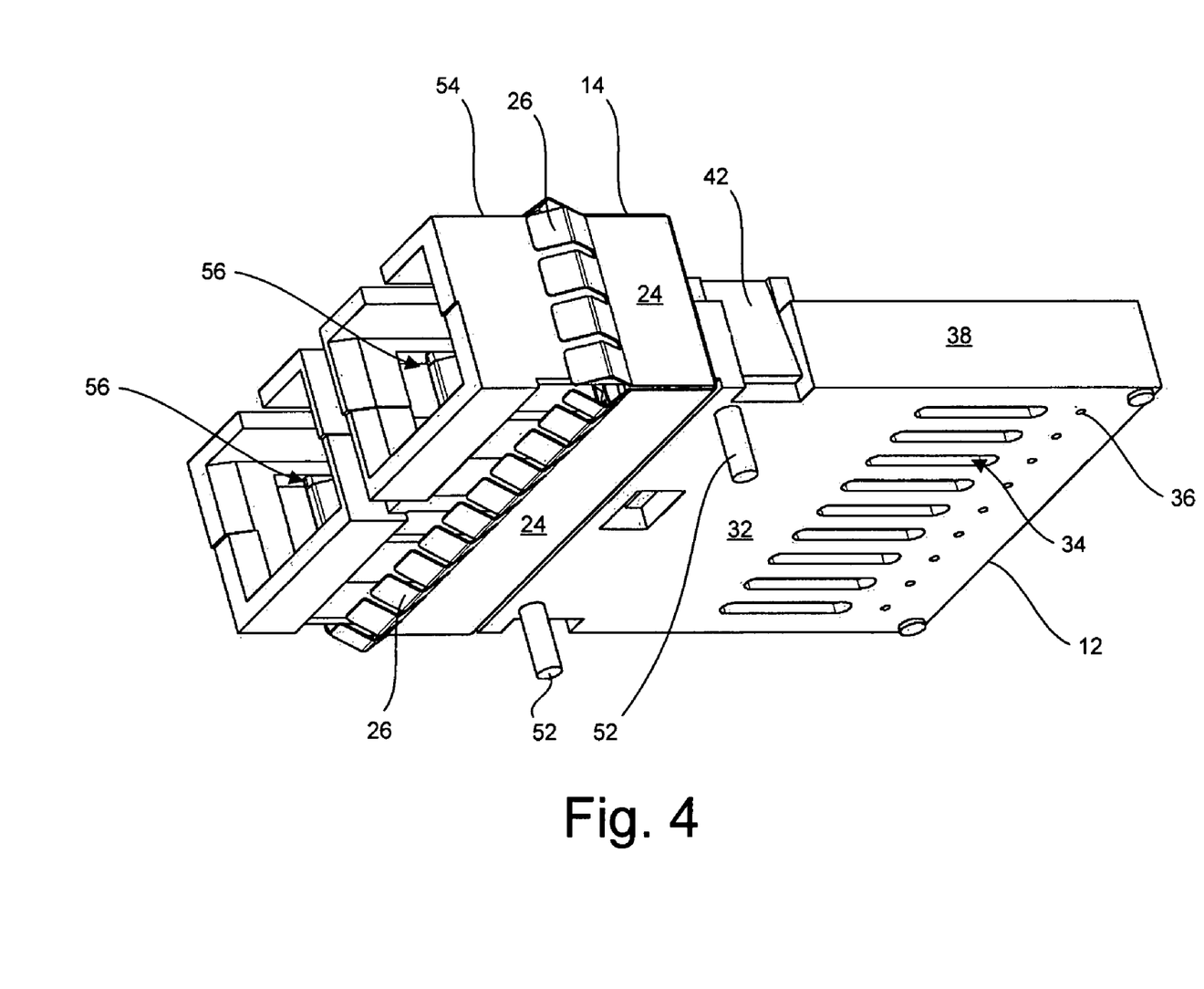

FIGS. 3 and 4 illustrate the details of lower housing 12 insert molded with EMI shield 14 in one embodiment of the invention. A housing floor 32 has vents 34 and pin openings 36. Vents 34 allow air flow through module 10 after assembly to provide ventilation during use. Pin openings 36 provide access for electrical connection to a host circuit board in a host device. Sidewalls 38 and 40 both include shoulders 42 for engaging cantilever hooks 84 (only one is visible) from upper housing 16. A back wall 44 includes a cantilever hook 46 for engaging the top surface of upper housing 16. A fiduciary 48 includes two U-shaped cutouts 50 for engaging an optoelectronic subassembly 60 (described later in FIG. 5). Mounting pins 52 (only one is visible) are provided to mount module 10 to a host circuit board in a host device. A nose 54 having two connector receptacles 56 for receiving a fiber optic connector. Nose 54 can be any connector form factor, including SC, LC, and MTRJ form factors.

Lower housing 12 is injection molded through mesh 22 of EMI shield 14. For example, a mold of lower housing 12 is loaded with EMI shield 14 and a thermoplastic material is injected into the mold. The thermoplastic material flows through the perforations of mesh 22 and forms a high-strength monolithic lower housing 12. Specifically, housing floor 32, sidewalls 38 and 40, and fiduciary 48 are injection molded through mesh 22 to be integral with nose 54 while shield sidewalls 24 and contact fingers 26 at least partially surround nose 54.

Figure 5:
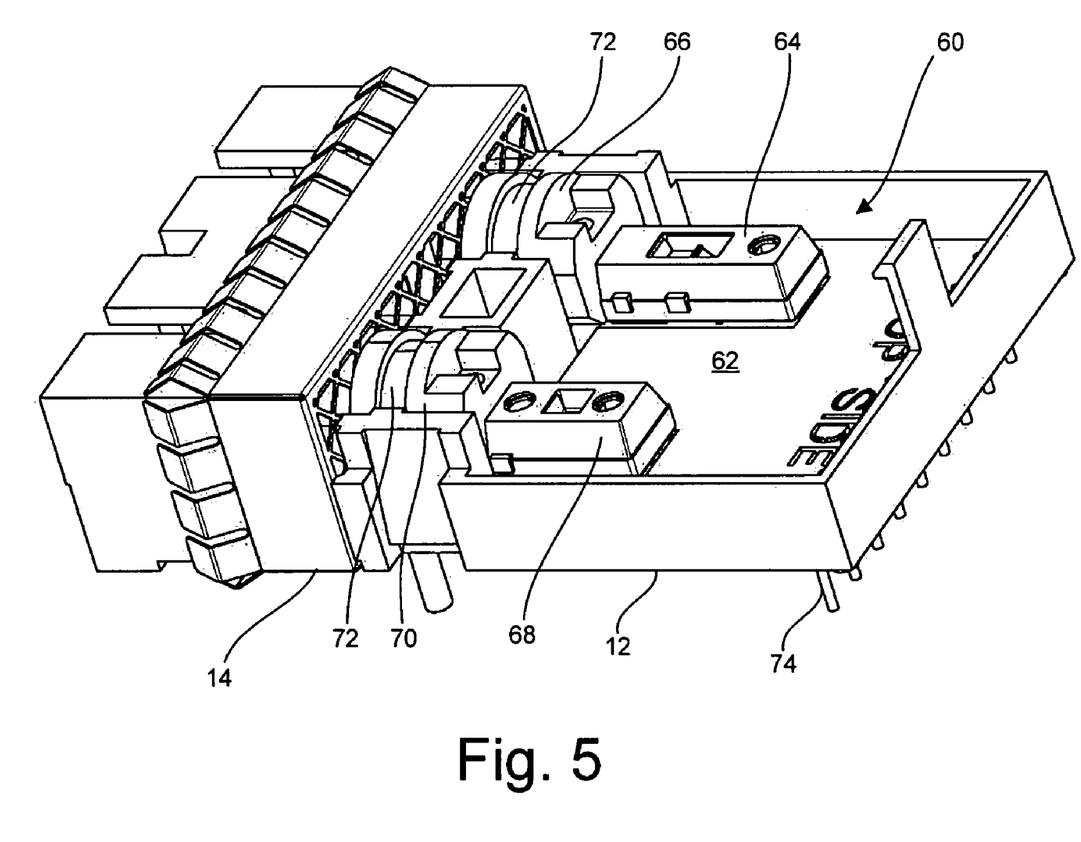
FIG. 5 illustrates an optoelectronic subassembly mounted in the lower housing of FIGS. 3 and 4 in one embodiment of the invention.

FIG. 5 illustrates optoelectronic subassembly 60 mounted in lower housing 12 in one embodiment of the invention. Optoelectronic subassembly 60 includes a printed circuit board (PCB) 62, an optical transmitter subassembly 64 (e.g., a light source such as a vertical cavity surface emitting laser) mounted on PCB 62, and a first connector interface (or transmitter port) 66 mounted to transmitter subassembly 64. Optoelectronic subassembly 60 may further include an optical receiver subassembly 68 (e.g., a photo detector such as a photodiode) mounted on PCB 62, and a receiver connector interface (or receiver port) 70 mounted to receiver subassembly 68. Each connector interface includes circumferential slot 72 on its outer surface that fits into U-shaped cutout 50 (FIG. 3). Once seated in lower housing 12, the ports of connector interface 66 and 70 are aligned with and pass through openings 28 (FIG. 2) of mesh 22 to receive fiber optic connectors from a fiber optic cable. Connector interface 66 and 70 can be any connector form factor, including SC, LC, and MTRJ form factors. When mounted inside lower housing 12, pins 74 (only one is labeled) of PCB 62 protrude through pin holes 36 (FIG. 4) for making electrical contact with a host circuit board.

Referring back to FIG. 1, upper housing 16 is snap-fitted onto lower housing 12 to enclose optoelectronic subassembly 60. Upper housing 16 includes vents 82 and cantilever hooks 84 (only one is visible).

Various other adaptations and combinations of features of the embodiments disclosed are within the scope of the invention. Numerous embodiments are encompassed by the following claims.

What is claimed is:

1. A fiber optic module, comprising
   an electromagnetic interference (EMI) shield, comprising:
      a conductive mesh defining (1) small openings that shield EMI and (2) at least one large opening that allows a fiber optic connector to pass through the conductive mesh; and
      conductive contact fingers;
   a first housing insert molded with the EMI shield.

2. The module of claim 1, wherein the EMI shield further comprises conductive shield sidewalls extending perpendicularly from a perimeter of the mesh, the contact fingers extending from the shield sidewalls.

3. The module of claim 2, wherein the first housing is injection molded through portions of the small openings in the mesh of the EMI shield and said at least one large opening remains unobstructed by the first housing.

4. The module of claim 3, wherein the first housing comprises:
   a non-conductive housing floor;
   non-conductive housing sidewalls; and
   a non-conductive nose defining at least one connector receptacle, wherein the housing floor and the housing sidewalls are injection molded through the portions of the small openings in the mesh of the EMI shield to be integral with the nose and so that the shield sidewalls and the contact fingers at least partially surround the nose.

5. The module of claim 4, further comprising:
   an optoelectronic subassembly mounted in the first housing; and
   a second housing mounted to the first housing to enclose the optoelectronic subassembly.

6. The module of claim 5, wherein the optoelectronic subassembly comprises:
   a circuit board;
   at least one optical subassembly mounted on the circuit board; and
   at least one connector interface.

7. The module of claim 6, wherein said at least one connector interface abuts the mesh about said at least one large opening for receiving the fiber optic connector.

8. The module of claim 6, wherein the at least one connector interface is selected from the group consisting of LC, SC, and MTRJ connector interfaces.

9. The module of claim 1, wherein the module is selected from the group consisting of a small form-factor pluggable (SFP) transceiver module, a Gigabit Interface Converter (GBIC) transceiver module, and 1×9 transceiver module.

10. A method for making a fiber optic module, comprising
    forming an electromagnetic interference (EMI) shield, comprising:
       forming a conductive mesh defining (1) small openings that shield EMI and (2) at least one large opening that allows a fiber optic connector to pass through the conductive mesh; and
       forming conductive contact fingers;
    insert-molding a first housing with the EMI shield.

11. The method of claim 10, wherein said forming an EMI shield further comprises forming conductive shield sidewalls extending perpendicularly from a perimeter of the mesh, wherein said forming conductive contact fingers further comprises forming contact fingers extending from the shield sidewalls.

12. The method of claim 11, wherein the first housing is injection molded through portions of the small openings in the mesh of the EMI shield and said at least one large opening remains unobstructed by the first housing.

13. The method of claim 12, wherein the first housing comprises:
    a non-conductive housing floor;
    non-conductive housing sidewalls; and
    a non-conductive nose defining at least one connector receptacle, wherein the housing floor and the housing sidewalls are injection molded trough the portions of the small openings in the mesh of the EMI shield to be integral with the nose and so that the shield sidewalls and the contact fingers at least partially surround the nose.

14. The module of claim 13, further comprising:
    mounting an optoelectronic subassembly in the first housing; and
    mounting a second housing to the first housing to enclose the optoelectronic subassembly.

15. The module of claim 14, wherein the optoelectronic subassembly comprises:
   a circuit board;
   at least one optical subassembly mounted on the circuit board; and
   at least one connector interface.

16. The module of claim 15, wherein said mounting an optoelectronic subassembly in the first housing comprises abutting said at least one connector interface to the mesh about said at least one large opening for receiving the fiber optic connector.

17. The module of claim 15, wherein the at least one connector interface is selected from the group consisting of LC and SC connector interface.

18. The module of claim 10, wherein the module is selected from the group consisting of a small form-factor pluggable (SFP) transceiver module, a Gigabit Interface Converter (GBIC) transceiver module, and 1×9 transceiver module.

* * * * *

UNITED STATES PATENT AND TRADEMARK OFFICE
CERTIFICATE OF CORRECTION

PATENT NO. : 7,111,994 B2  Page 1 of 1
APPLICATION NO. : 10/808672
DATED : September 26, 2006
INVENTOR(S) : Matthew K. Schwiebert et al.

It is certified that error appears in the above-identified patent and that said Letters Patent is hereby corrected as shown below:

Column 4, Line 58, Claim 13, delete "trough" and insert -- through --.

Signed and Sealed this

Twenty-sixth Day of October, 2010

David J. Kappos
*Director of the United States Patent and Trademark Office*